(12) United States Patent
Boukaftane

(10) Patent No.: US 9,740,099 B2
(45) Date of Patent: Aug. 22, 2017

(54) FLEXOGRAPHIC PRINTING PLATE WITH IMPROVED CURE EFFICIENCY

(71) Applicant: MacDermid Printing Solutions, LLC, Waterbury, CT (US)

(72) Inventor: Chouaib Boukaftane, Decatur, GA (US)

(*) Notice: Subject to any disclaimer, the term of this patent is extended or adjusted under 35 U.S.C. 154(b) by 0 days.

(21) Appl. No.: 14/539,171

(22) Filed: Nov. 12, 2014

(65) Prior Publication Data

US 2016/0131973 A1   May 12, 2016

(51) Int. Cl.
- G03F 7/20 (2006.01)
- G03F 7/031 (2006.01)
- G03F 7/029 (2006.01)
- G03F 7/095 (2006.01)

(52) U.S. Cl.
CPC ........... *G03F 7/031* (2013.01); *G03F 7/029* (2013.01); *G03F 7/095* (2013.01)

(58) Field of Classification Search
CPC ....................................................... B41M 1/10
See application file for complete search history.

(56) References Cited

U.S. PATENT DOCUMENTS

| | | |
|---|---|---|
| 3,265,765 A | 8/1966 | Holden et al. |
| 3,867,153 A | 2/1975 | MacLachlan |
| 4,264,705 A | 4/1981 | Allen |
| 4,320,188 A | 3/1982 | Heinz et al. |
| 4,323,636 A | 4/1982 | Chen |
| 4,323,637 A | 4/1982 | Chen et al. |
| 4,369,246 A | 1/1983 | Chen et al. |
| 4,423,135 A | 12/1983 | Chen et al. |
| 4,427,759 A | 1/1984 | Gruetzmacher et al. |
| 4,540,649 A | 9/1985 | Sakurai |

(Continued)

FOREIGN PATENT DOCUMENTS

| | | |
|---|---|---|
| EP | 0 456 336 | 11/1991 |
| EP | 0 640 878 | 3/1995 |
| GB | 1 366 769 | 9/1974 |

OTHER PUBLICATIONS http://www.mufong.com.tw/ciba/ciba_photo_tds/tds_darocur_tpo.pdf ( pp. 1-3) 2015.*

(Continued)

*Primary Examiner* — Chanceity Robinson
(74) *Attorney, Agent, or Firm* — Carmody Torrance Sandak & Hennessey LLP

(57) ABSTRACT

A method of making a relief image printing element comprising a plurality of relief printing dots. The method includes the steps of: (a) providing at least one photocurable layer disposed on the backing layer, the at least one photocurable layer being capable of being selectively crosslinked and cured upon exposure to actinic radiation, (b) imagewise exposing the at least one photocurable layer to actinic radiation to selectively crosslink and cure portions of the at least one photocurable layer; and (c) developing the relief image printing element to separate and remove uncrosslinked and uncured portions of the at least one photocurable layer to reveal the relief image therein. The at least one photocurable layer comprises (i) an ethylenically unsaturated monomer; (ii) a binder; and (iii) a photoinitiator exhibiting a quantum yield of initiation (Qi) of more than 0.05 at a 365 nm wavelength.

10 Claims, 1 Drawing Sheet

2,2-Dimethoxy-1,2-diphenylethan-1-one

Nominal 5% - Plate %

10% - 0.9 %

(56) References Cited

U.S. PATENT DOCUMENTS

| | | | |
|---|---|---|---|
| 4,622,088 A | 11/1986 | Min | |
| 5,077,402 A | 12/1991 | Desobry et al. | |
| 5,135,827 A | 8/1992 | Bohm et al. | |
| 5,223,375 A | 6/1993 | Berrier et al. | |
| 5,262,275 A | 11/1993 | Fan | |
| 5,330,882 A | 7/1994 | Kawaguchi et al. | |
| 5,925,500 A | 7/1999 | Yang | |
| 6,238,837 B1 | 5/2001 | Fan | |
| 8,158,331 B2 | 4/2012 | Recchia | |
| 8,486,607 B2 | 7/2013 | Veres et al. | |
| 2003/0129533 A1 | 7/2003 | Goodin et al. | |
| 2008/0305407 A1 | 12/2008 | Zwadlo et al. | |
| 2010/0215865 A1* | 8/2010 | Keoshkerian | B41C 1/003 427/511 |
| 2011/0079158 A1 | 4/2011 | Recchia | |
| 2012/0003437 A1 | 1/2012 | Wada et al. | |
| 2012/0214102 A1* | 8/2012 | Recchia | G03F 7/202 430/306 |
| 2013/0059089 A1* | 3/2013 | Gullentops | B41C 1/182 427/510 |
| 2013/0146346 A1* | 6/2013 | Nakamoto | G03F 7/004 174/258 |
| 2014/0057205 A1* | 2/2014 | Choi | G03F 7/09 430/286.1 |
| 2014/0057207 A1* | 2/2014 | Baldwin | G03F 7/201 430/306 |
| 2014/0057208 A1* | 2/2014 | Schieffer, Jr. | G03F 7/20 430/306 |
| 2014/0071653 A1* | 3/2014 | Thompson | G02B 6/005 362/19 |
| 2014/0123873 A1 | 5/2014 | Chopra et al. | |
| 2014/0141378 A1 | 5/2014 | Recchia et al. | |
| 2014/0211334 A1 | 7/2014 | Yoshibayashi et al. | |

OTHER PUBLICATIONS http://adhesives.specialchem.com/product/a-basf-irgacure-819 ( p. 1) 2015.*

International Search Report dated Aug. 26, 2016 issued in connection with corresponding PCT application.

* cited by examiner

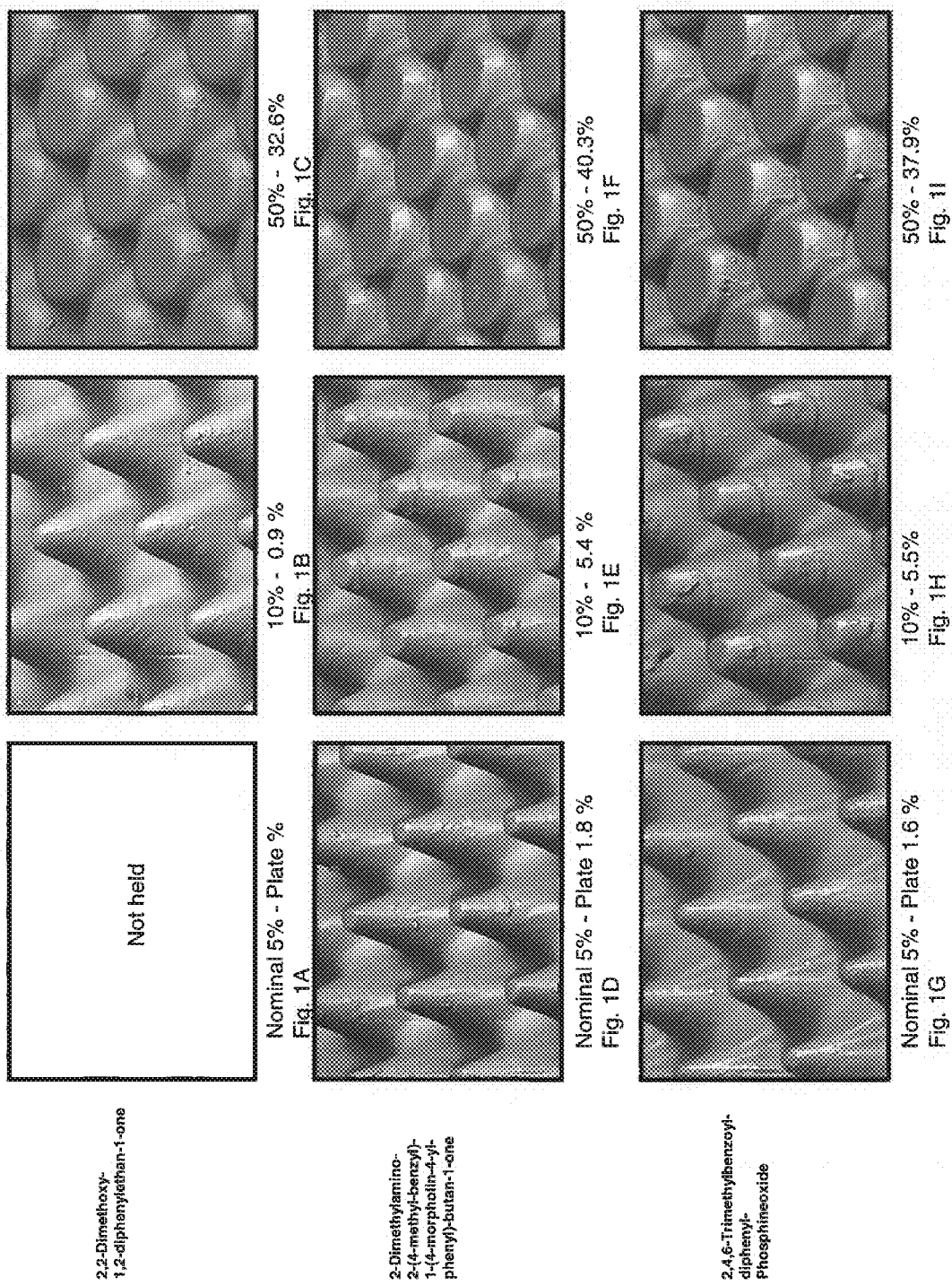

FLEXOGRAPHIC PRINTING PLATE WITH IMPROVED CURE EFFICIENCY

FIELD OF THE INVENTION

The present invention relates generally to printing plate formulations for producing flexographic printing plates with improved cure efficiency.

BACKGROUND OF THE INVENTION

Flexography is a method of printing that is commonly used for high-volume runs. Flexography is employed for printing on a variety of substrates such as paper, paperboard stock, corrugated board, films, foils and laminates. Newspapers and grocery bags are prominent examples. Coarse surfaces and stretch films can be economically printed only by means of flexography. Flexographic printing plates are relief plates with image elements raised above open areas. Generally, the plate is somewhat soft, and flexible enough to wrap around a printing cylinder, and durable enough to print over a million copies. Such plates offer a number of advantages to the printer, based chiefly on their durability and the ease with which they can be made.

A typical flexographic printing plate as delivered by its manufacturer is a multilayered article made of, in order, a backing, or support layer; one or more unexposed photocurable layers; optionally a protective layer or slip film; and often a protective cover sheet.

The support sheet or backing layer lends support to the plate. The support sheet, or backing layer, can be formed from a transparent or opaque material such as paper, cellulose film, plastic, or metal. Preferred materials include sheets made from synthetic polymeric materials such as polyesters, polystyrene, polyolefins, polyamides, and the like. Generally the most widely used support layer is a flexible film of polyethylene terephthalate. The support sheet can optionally comprise an adhesive layer for more secure attachment to the photocurable layer(s). Optionally, an antihalation layer may also be provided between the support layer and the one or more photocurable layers. The antihalation layer is used to minimize halation caused by the scattering of UV light within the non-image areas of the photocurable resin layer.

The photocurable layer(s) include photopolymers, monomers, initiators, reactive or non-reactive diluents, fillers, and dyes. The term "photocurable" refers to a composition which undergoes polymerization, cross-linking, or any other curing or hardening reaction in response to actinic radiation with the result that the unexposed portions of the material can be selectively separated and removed from the exposed (cured) portions to form a three-dimensional relief pattern of cured material. Preferred photocurable materials include an elastomeric compound, an ethylenically unsaturated compound having at least one terminal ethylene group, and a photoinitiator. Photocurable materials are disclosed, for example, in European Patent Application Nos. 0 456 336 A2 and 0 640 878 A1 to Goss, et al., British Patent No. 1,366,769, U.S. Pat. No. 5,223,375 to Berrier, et al., U.S. Pat. No. 3,867,153 to MacLahan, U.S. Pat. No. 4,264,705 to Allen, U.S. Pat. Nos. 4,323,636, 4,323,637, 4,369,246, and 4,423,135 all to Chen, et al., U.S. Pat. No. 3,265,765 to Holden, et al., U.S. Pat. No. 4,320,188 to Heinz, et al., U.S. Pat. No. 4,427,759 to Gruetzmacher, et al., U.S. Pat. No. 4,622,088 to Min, and U.S. Pat. No. 5,135,827 to Bohm, et al., the subject matter of each of which is herein incorporated by reference in its entirety. More than one photocurable layer may be used.

The photocurable materials generally cross-link (cure) and harden through radical polymerization in at least some actinic wavelength region. The type of radiation used is dependent on the type of photoinitiator in the photopolymerizable layer. As used herein, actinic radiation is radiation capable of effecting a chemical change in an exposed moiety in the materials of the photocurable layer. Actinic radiation includes, for example, amplified (e.g., laser) and non-amplified light, particularly in the UV and violet wavelength regions. Any conventional sources of actinic radiation can be used for this exposure step, including, for example, carbon arcs, mercury-vapor arcs, fluorescent lamps, electron flash units, electron beam units and photographic flood lamps.

The slip film is a thin layer, which protects the photopolymer from dust and increases its ease of handling. In a conventional ("analog") plate making process, the slip film is transparent to UV light. In this process, the printer peels the cover sheet off the printing plate blank, and places a negative on top of the slip film layer. The plate and negative are then subjected to flood-exposure by UV light through the negative. The areas exposed to the light cure, or harden, and the unexposed areas are removed (developed) to create the relief image on the printing plate. Instead of a slip film, a matte layer may also be used to improve the ease of plate handling. The matte layer typically comprises fine particles (silica or similar) suspended in an aqueous binder solution. The matte layer is coated onto the photopolymer layer and then allowed to air dry. A negative is then placed on the matte layer for subsequent UV-flood exposure of the photocurable layer.

In a "digital" or "direct to plate" plate making process, a laser is guided by an image stored in an electronic data file, and is used to create an in situ negative in a digital (i.e., laser ablatable) masking layer, which is generally a slip film that has been modified to include a radiation opaque material. Portions of the laser ablatable layer are ablated by exposing the masking layer to laser radiation at a selected wavelength and power of the laser. Examples of laser ablatable layers are disclosed for example, in U.S. Pat. No. 5,925,500 to Yang, et al., and U.S. Pat. Nos. 5,262,275 and 6,238,837 to Fan, the subject matter of each of which is herein incorporated by reference in its entirety.

After imaging, the photosensitive printing element is developed to remove the unpolymerized portions of the layer of photocurable material and reveal the crosslinked relief image in the cured photosensitive printing element. Typical methods of development include washing the printing element with various solvents or water, often with a brush. Other possibilities for development include the use of an air knife or heat plus a blotter. The resulting surface has a relief pattern that reproduces the image to be printed and which typically includes both solid areas and patterned areas comprising a plurality of relief printing dots. After the relief image is developed, the printing element may be mounted on a press and printing commenced.

A "back exposure" step may also be performed prior to imaging the photosensitive printing element (or immediately after imaging the photosensitive printing element). "Back exposure" refers to a blanket exposure to actinic radiation of the photopolymerizable layer on the side opposite that which does, or ultimately will, bear the relief. This step is typically accomplished through a transparent support layer and is used to create a shallow layer of photocured material, i.e., the "floor," on the support side of the photocurable layer. The purpose of the floor is generally to sensitize the photocurable layer and to establish the depth of relief.

The shape of the dots and the depth of the relief, among other factors, affect the quality of the printed image. It is very difficult to print small graphic elements such as fine dots, lines and even text using flexographic printing plates while maintaining open reverse text and shadows. In the lightest areas of the image (commonly referred to as highlights) the density of the image is represented by the total area of dots in a halftone screen representation of a continuous tone image. For Amplitude Modulated (AM) screening, this involves shrinking a plurality of halftone dots located on a fixed periodic grid to a very small size, the density of the highlight being represented by the area of the dots. For Frequency Modulated (FM) screening, the size of the halftone dots is generally maintained at some fixed value, and the number of randomly or pseudo-randomly placed dots represent the density of the image. In both instances, it is necessary to print very small dot sizes to adequately represent the highlight areas.

Maintaining small dots on flexographic plates can be very difficult due to the nature of the platemaking process. In digital platemaking processes that use a UV-opaque mask layer, the combination of the mask and UV exposure produces relief dots that have a generally conical shape. The smallest of these dots are prone to being removed during processing, which means no ink is transferred to these areas during printing (the dot is not "held" on plate and/or on press). Alternatively, if the dot survives processing they are susceptible to damage on press. For example small dots often fold over and/or partially break off during printing causing either excess ink or no ink to be transferred.

Furthermore, photocurable resin compositions typically cure through radical polymerization, upon exposure to actinic radiation. However, the curing reaction can be inhibited by molecular oxygen, which is typically dissolved in the resin compositions, because the oxygen functions as a radical scavenger. It is therefore desirable for the dissolved oxygen to be removed from the resin composition, and/or to stop atmospheric oxygen from dissolving in the resin, before image-wise exposure so that the photocurable resin composition can be more rapidly and uniformly cured.

The removal of dissolved oxygen may be accomplished in various ways. For example, the photosensitive resin plate may be placed in an atmosphere of inert gas, such as carbon dioxide gas or nitrogen gas, before exposure in order to displace the dissolved oxygen. Another approach involves subjecting the plates to a preliminary exposure (i.e., "bump exposure") of actinic radiation. During bump exposure, a low intensity "pre-exposure" dose of actinic radiation is used to sensitize the resin before the plate is subjected to the higher intensity main exposure dose of actinic radiation. The bump exposure is applied to the entire plate area and is a short, low dose exposure of the plate that reduces the concentration of oxygen, which inhibits photopolymerization of the plate (or other printing element) and aids in preserving fine features (i.e., highlight dots, fine lines, isolated dots, etc.) on the finished plate. Other efforts have involved special plate formulations alone or in combination with the bump exposure.

U.S. Pat. No. 5,330,882 to Kawaguchi, the subject matter of which is herein incorporated by reference in its entirety, suggests the use of a separate dye that is added to the resin to absorb actinic radiation at wavelengths at least 100 nm removed from the wavelengths absorbed by the main photoinitiator, which allows separate optimization of the initiator amounts for the bump and main initiators.

U.S. Pat. No. 4,540,649 to Sakurai, incorporated herein by reference in its entirety, describes a photopolymerizable composition that contains at least one water soluble polymer, a photopolymerization initiator and a condensation reaction product of N-methylol acrylamide, N-methylol methacrylamide, N-alkyloxymethyl acrylamide or N-alkyloxymethyl methacrylamide and a melamine derivative. According to the inventors, the composition eliminates the need for pre-exposure conditioning and produces a chemically and thermally stable plate.

U.S. Pat. Pub. No. 2014/0141378 to Recchia, the subject matter of which is herein incorporated by reference in its entirety, describes a method of imaging a photocurable printing blank in a digital platemaking process that includes the steps of laminating an oxygen barrier membrane to a top of a laser ablated mask layer and exposing the printing blank to actinic radiation through the oxygen barrier membrane and mask layer to selectively crosslink and cure portions of the at least one photocurable layer. The oxygen barrier membrane is removed prior to the development step. The presence of the oxygen barrier membrane produces printing dots having desired characteristics. The method can also be used with an analog platemaking process that uses a negative instead of an ablatable mask layer, or, in the alternative, the negative itself can be used as the oxygen barrier layer.

U.S. Pat. Pub. No. 2014/005/7207 to Baldwin, the subject matter of which is herein incorporated by reference in its entirety, describes the use of one or more UV LED assemblies in selectively crosslinking and curing sheet photopolymers can produce a relief image comprising flexo printing dots having desirable geometric characteristics.

As described in U.S. Pat. No. 8,158,331 to Recchia and U.S. Pat. Pub. No. 2011/0079158 to Recchia et al., the subject matter of each of which is herein incorporated by reference in its entirety, it has been found that a particular set of geometric characteristics define a flexo dot shape that yields superior printing performance, including but not limited to (1) planarity of the dot surface; (2) shoulder angle of the dot; (3) depth of relief between the dots; and (4) sharpness of the edge at the point where the dot top transitions to the dot shoulder.

Flexo plates imaged by typical digital imaging processes tend to create dots with rounded tops.

A rounded dot surface is not ideal from a printing perspective because the size of the contact patch between the print surface and the dot varies exponentially with impression force. In contrast, a planar dot surface should have the same contact patch size within a reasonable range of impression and is thus preferred, especially for dots in the highlight range (0-10% tone).

A second parameter is the angle of the dot shoulder. The shoulder angle can vary depending on the size of the dots as well. There are two competing geometric constraints on shoulder angle—dot stability and impression sensitivity. A large shoulder angle minimizes impression sensitivity and gives the widest operating window on press, but at the expense of dot stability and durability. In contrast, a lower shoulder angle improves dot stability but makes the dot more sensitive to impression on press A third parameter is plate relief, which is expressed as the distance between the floor of the plate and the top of a solid relief. The dot relief is to a certain extent linked to the dot's shoulder angle.

A fourth characteristic is the presence of a well-defined boundary between the planar dot top and the shoulder. Dots made using standard digital flexo photopolymer imaging processes tend to exhibit rounded dot edges. It is generally preferred that the dot edges be sharp and defined. These well-defined dot edges better separate the "printing" portion from the "support" portion of the dot, allowing for a more consistent contact area between the dot and the substrate during printing. Edge sharpness can be defined as the ratio of $r_e$, the radius of curvature (at the intersection of the shoulder and the top of the dot) to p, the width of the dot's top or printing surface, as described for example in U.S. Pat. No. 8,158,331 to Recchia and U.S. Pat. Pub. No. 2011/0079158 to Recchia et al., the subject matter of each of which is herein incorporated by reference in its entirety. For a truly round-tipped dot, it is difficult to define the exact printing surface because there is not really an edge in the commonly understood sense, and the ratio of $r_e$:p can approach 50%. In contrast, a sharp-edged dot would have a very small value of $r_e$, and $r_e$:p would approach zero. In practice, an $r_e$:p of less than 5% is preferred, with an $r_e$:p of less than 2% being most preferred.

SUMMARY OF THE INVENTION

It is an object of the present invention to provide an improved photocurable composition for producing flexographic relief image printing elements that is capable of producing printing dots having desired geometric characteristics.

It is another object of the present invention to provide a process of making a relief image printing element having printing dots with desired geometric characteristics that does not require additional process steps in the manufacturing process.

It is still another object of the present invention to provide a process of making a relief image printing element that does not require altering of the type, power and incident angle of radiation during the exposure step.

It is still another object of the present invention to provide a process of making a relief image printing element that can be conducted in the presence of atmospheric oxygen while producing printing dots having desired geometric characteristics.

It is still another object of the present invention to provide an improved photosensitive printing plate formulation having improved cure efficiency.

To that end, in one embodiment, the present invention relates generally to a photocurable composition for producing a relief image printing element, the photocurable composition comprising:
  a) an ethylenically unsaturated monomer;
  b) a binder;
  c) a photoinitiator, the photoinitiator exhibiting a quantum yield of initiation (Qi) of more than 0.05 at a 365 nm wavelength.

In another embodiment, the present invention relates generally to a method of making a relief image printing element, the method comprising the step of:
  a) providing at least one photocurable layer disposed on the backing layer, the at least one photocurable layer being capable of being selectively crosslinked and cured upon exposure to actinic radiation, the at least one photocurable layer comprising:
    i) an ethylenically unsaturated monomer;
    ii) a binder;
    iii) a photoinitiator, the photoinitiator exhibiting a quantum yield of initiation (Qi) of more than 0.05 at a 365 nm wavelength;
  b) imagewise exposing the at least one photocurable layer to actinic radiation to selectively crosslink and cure portions of the at least one photocurable layer; and
  c) developing the relief image printing element to separate and remove uncrosslinked and uncured portions of the at least one photocurable layer to reveal the relief image therein;
  wherein the relief image comprise a plurality of relief image printing dots, wherein the plurality of relief image printing dots exhibit an edge sharpness of the dots such that the ratio of the radius of curvature at the intersection of the shoulder and the top surface of the dot, $r_e$, to the width of the top of the dot, p, is less than 5%.

BRIEF DESCRIPTION OF THE FIGURES

FIGS. 1A-1I depict printing dots produced in accordance with the present invention using different photoinitiators.

In all FIGS. 1A-1I, the photopolymer composition was held constant except that the photoinitiator used was selected from one of the three compounds indicated in the far left hand column of FIGS. 1A-1I.

FIG. 1A indicates that 5% dots were not held (i.e., the dots did not form as dots) using 2,2-Dimethoxy-1,2-diphenylethan-1-one.

FIG. 1B indicates that 10% dots yielded 0.9% dots on the plate using 2,2-Dimethoxy-1,2-diphenylethan-1-one.

FIG. 1C indicates that 50% dots yielded 32.6% dots on the plate using 2,2-Dimethoxy-1,2-diphenylethan-1-one.

FIG. 1D indicates that 5% dots yielded 1.8% dots on the plate using 2-Dimethylamino-2-(4-methyl-benzyl)-1-(4-morpholin-4-yl-phenyl)-butan-1-one.

FIG. 1E indicates that 10% dots yielded 5.4% dots on the plate using 2-Dimethylamino-2-(4-methyl-benzyl)-1-(4-morpholin-4-yl-phenyl)-butan-1-one.

FIG. 1F indicates that 50% dots yielded 40.3% dots on the plate using 2-Dimethylamino-2-(4-methyl-benzyl)-1-(4-morpholin-4-yl-phenyl)-butan-1-one.

FIG. 1G indicates that 5% dots yielded 1.6% dots on the plate using 2,4,6-Trimethylbenzoyl-diphenyl-phosphine oxide.

FIG. 1H indicates that 10% dots yielded 5.5% dots on the plate using 2,4,6-Trimethylbenzoyl-diphenyl-phosphine oxide.

FIG. 1I indicates that 50% dots yielded 37.9% dots on the plate using 2,4,6-Trimethylbenzoyl-diphenyl-phosphine oxide.

DETAILED DESCRIPTION OF THE PREFERRED EMBODIMENTS

The inventors of the present invention have found that the use of particular photoinitiators in a photocurable printing plate composition produces print dots having desired geometric characteristics without the need for additional process steps. Thus, the photocurable compositions described herein produce relief image printing plates having printing dots with the desired geometric characteristics without the need for a barrier layer. In addition, the process described herein can also be conducted in the presence of atmospheric oxygen.

To that end, in one embodiment, the present invention relates generally to a method of making a relief image printing element, the method comprising the step of:
  a) providing at least one photocurable layer disposed on the backing layer, the at least one photocurable layer being capable of being selectively crosslinked and cured upon exposure to actinic radiation, the at least one photocurable layer comprising:

i) an ethylenically unsaturated monomer;
ii) a binder;
iii) a photoinitiator, the photoinitiator exhibiting a quantum yield of initiation (Qi) of more than 0.05 at a 365 nm wavelength;
b) imagewise exposing the at least one photocurable layer to actinic radiation to selectively crosslink and cure portions of the at least one photocurable layer; and
c) developing the relief image printing element to separate and remove uncrosslinked and uncured portions of the at least one photocurable layer to reveal the relief image therein;

wherein the relief image comprise a plurality of relief image printing dots, wherein the plurality of relief image printing dots exhibit an edge sharpness of the dots such that the ratio of the radius of curvature at the intersection of the shoulder and the top surface of the dot, $r_e$, to the width of the top of the dot, p, is less than 5%.

The present invention also relates generally to a photocurable composition for producing a relief image printing element, the photocurable composition comprising:
a) an ethylenically unsaturated monomer;
b) a binder;
c) a photoinitiator, the photoinitiator exhibiting a quantum yield of initiation (Qi) of more than 0.05 at a 365 nm wavelength.

The inventors of the present invention have found that the inclusion of particular photoinitiators into the photocurable composition having a higher quantum yield of initiation produces a printing element with finer and sharper printing dots. In one embodiment, these photoinitiators may comprise certain α-aminoketones.

The initiation rate of polymerization (Ri) was measured to evaluate the suitability of various photoinitiators, which can be done by real-time FTIR or RTIR.

Ri is described by Equation 1:

$$Ri = I_a \cdot Q_i \quad (1)$$

$I_a$ is the absorbed intensity (mW) and is calculated as set forth below in Equation 2.

$Q_i$ is the quantum yield of initiation and is defined as the number of initiated polymerizing chains per absorbed photon. $Q_i$ is influenced by all the photochemical/physical phenomena that can affect an excited molecule after absorption of one photon.

$$I_a = I_0 \cdot (1 - 10^{-OD}) \quad (2)$$

$$OD = \epsilon \cdot [PI] \cdot L \quad (3)$$

Wherein:
$I_0$ = Incident intensity (mW)
$\epsilon$ = Extinction coefficient
[PI] = Photoinitiator concentration (mol/l)
L = Thickness (cm)

$Q_i$ is calculated via an experimental determination of the rate of polymerization ($R_p$) and by the use of the propagation and termination constants ($k_p$ and $k_t$) for acrylate monomers that are found in the literature.

In order for a photoinitiator to react effectively, it must first effectively absorb the service wavelength, which means a high $I_a$, and thus a high $\epsilon$ value. Then, the absorbed energy must be converted in a high number of initiating radicals, which results in a high $Q_i$ ratio.

In order to compare various photoinitiators, $\epsilon$ and $Q_i$ were determined for three photoinitiators at 365 nm and the results are depicted in Table 1.

| Photoinitiator | $\epsilon_{365nm}$ $(1 \cdot cm^{-1}) \cdot mol^{-1}$ | $Q_{i\text{-}365nm}$ |
|---|---|---|
| 2,2-dimethoxy-2-phenylacetophenone | 141 | 0.014 |
| 1-butanone-2-(dimethylamino)-2-[(4-methylphenyl)methyl]-1-[4-(4-morpholinyl)phenyl] | 1247 | 0.081 |
| Diphenyl(2,4,6-trimethylbenzoyl)phosphine oxide | 518 | 0.118 |

Printing plate formulations were prepared using the photoinitiators described in Table 1 at the concentrations set forth in Table 2. Table 2 also lists a range of concentration values that may be used for each ingredient of the sample photocurable composition.

Once the photocurable compositions were prepared using the photoinitiators described above, the photocurable compositions were imagewise exposed to actinic radiation and then developed using solvent development to remove uncured photopolymer.

TABLE 2

Sample Photocurable Composition

| | Example 1 (Wt. %) | Range (Wt. %) |
|---|---|---|
| Kraton ® D1114 (Rubber) | 67.0 | 60-80 |
| PB B-1000 | 13.0 | 10-20 |
| HDDA | 15.0 | 10-20 |
| BHT | 1.92 | 0.5-5.0 |
| Tinuvin 1130 | 0.075 | 0.02-0.20 |
| Dye | 0.01 | 0.005-0.05 |
| Photoinitiator | 3.0 | 1.5-5.0 |

Based on the results, it was determined that a Quantum yield of initiation (Qi) higher than about 0.05 at the 365 nm wavelength, more preferably higher than about 0.075 at the 365 nm wavelength, and most preferably higher than about 0.08 at the 365 nm wavelength was capable of producing a printing plate having printing dots with the desired geometric characteristics as illustrated in FIGS. 1A-1I.

A high extinction coefficient is also necessary but is not sufficient in and of itself for good initiation. Indeed, after the light absorption, the photoinitiator is promoted to its singlet then triplet states from which it can undergo different reactions, including the generation of radicals, quenching by the monomer, oxygen inhibition and thermal deactivation. At this stage, there is already a risk that the effectiveness of the photoinitiator is reduced, even for a high extinction coefficient molecule. Assuming that everything goes well and the radicals production is dominant, the type of radicals produced may still have different sensitivities towards oxygen depending on their reactivities. Again, a high coefficient of extinction would not necessarily be enough if these radicals have a long enough lifetime, making them too sensitive to oxygen and thus reducing their effectiveness in initiating the crosslinking reaction.

Thus, it is desirable that the extinction coefficient be higher than about 300 $l \cdot cm^{-1} \cdot mol^{-1}$ at the 365 nm wavelength, more preferably higher than about 400 $l \cdot cm^{-1} \cdot mol^{-1}$ at the 365 nm wavelength, and most preferably higher than about 500 $l \cdot cm^{-1} \cdot mol^{-1}$ at the 365 nm wavelength.

Based on the values of Qi and $\epsilon$ shown in Table 1, both 1-butanone-2-(dimethylamino)-2-[(4-methylphenyl)methyl]-1-[4-(4-morpholinyl)phenyl] and Diphenyl(2,4,6-trimethylbenzoyl)phosphine oxide are faster photoinitiators than 2,2-dimethoxy-2-phenylacetophenone. This accounts for the smaller and sharper dots that were obtained using these products as shown in FIGS. 1D-1F and 1G-1I. In addition, although Diphenyl(2,4,6-trimethylbenzoyl)phosphine oxide has a slightly larger Qi than 1-butanone-2-(dimethylamino)-2-[(4-methylphenyl)methyl]-1-[4-(4-morpholinyl)phenyl], the much higher absorptivity of the latter allowed it to offset this difference and yield sharper dots. Thus, even though both 1-butanone-2-(dimethylamino)-2-[(4-methylphenyl)methyl]-1-[4-(4-morpholinyl)phenyl] and Diphenyl(2,4,6-trimethylbenzoyl)phosphine oxide yield good results, 1-butanone-2-(dimethylamino)-2-[(4-methylphenyl)methyl]-1-[4-(4-morpholinyl)phenyl]seems to be faster than Diphenyl(2,4,6-trimethylbenzoyl)phosphine oxide.

As can be seen from FIGS. 1D-1F and 1G-1I, 1-butanone-2-(dimethylamino)-2-[(4-methylphenyl)methyl]-1-[4-(4-morpholinyl)phenyl] and Diphenyl(2,4,6-trimethylbenzoyl)phosphine oxide yield flat and fine dots because of their high initiation rate due to their high absorptivity and quantum yield of initiation. It is expected that a similar behavior would also result from other photoinitiators that exhibit comparable properties.

In addition, one or more antioxidants such as 1,3,5-trimethyl-2,4,6-tris(3,5-di-tert-butyl-4-hydroxybenzyl)benzene, butylated hydroxytoluene (BHT), alkylated phenols, e.g., 2-6-di-tert-butyl-4-methylphenol; alkylated bis-phenols, e.g., 2,2-methylene-bis-(4-methyl-6-tert-butylphenol); 2-(4-hydroxy-3,5-di-tert-butylanilino)-4,6-bis-(n-octyl thio)-1,3,5-triazine; polymerized trimethyldihydroquinone; and dilauryl thiopropionate can also be used in the compositions of the invention in combination with the above referenced additives to further tailor dot shapes in terms of dot angle, dot tops, etc. In one preferred embodiment, the antioxidant is 1,3,5-trimethyl-2,4,6-tris-(3,5-di-tert-butyl-4-hydroxybenzyl)benzene, available from Albemarle under the tradename Ethanox 330.

The photocurable composition of the present invention comprises one or more binders, monomers and plasticizers in combination with the one or more photo-initiators described above.

The binder type is not critical to the photopolymer composition and most, if not all, styrenic copolymer rubbers are usable in the compositions of the invention. Suitable binders can include natural or synthetic polymers of conjugated diolefin hydrocarbons, including 1,2-polybutadiene, 1,4-polybutadiene, butadiene/acrylonitrile, butadiene/styrene, thermoplastic-elastomeric block copolymers e.g., styrene-butadiene-styrene block copolymer, styrene-isoprene-styrene block copolymer, etc., and copolymers of the binders. It is generally preferred that the binder be present in at least an amount of 60% by weight of the photosensitive layer. The term binder, as used herein, also encompasses core shell microgels or blends of microgels and pre-formed macromolecular polymers.

Non-limiting examples of binders that are usable in the compositions of the instant invention include styrene isoprene styrene (SIS), a commercial product of which is available from Kraton Polymers, LLC under the tradename Kraton® D1161; styrene isoprene butadiene styrene (SIBS), a commercial product of which is available from Kraton Polymers, LLC under the tradename Kraton® D1171; styrene butadiene styrene (SBS), a commercial product of which is available from Kraton Polymers, LLC under the tradename Kraton® DX405; and triblock copolymers based on styrene and isoprene, a commercial product of which is available from Kraton Polymers, LLC under the tradename Kraton® D1114.

Monomers suitable for use in the present invention are addition-polymerizable ethylenically unsaturated compounds. The photocurable composition may contain a single monomer or a mixture of monomers which form compatible mixtures with the binder(s) to produce clear (i,e., non-cloudy) photosensitive layers. The monomers are typically reactive monomers especially acrylates and methacrylates. Such reactive monomers include, but are not limited to, trimethylolpropane triacrylate, hexanediol diacrylate, 1,3-butylene glycol diacrylate, diethylene glycol diacrylate, 1,6-hexanediol diacrylate, neopentyl glycol diacrylate, polyethylene glycol-200 diacrylate, tetraethylene glycol diacrylate, triethylene glycol diacrylate, pentaerythritol tetraacrylate, tripropylene glycol diacrylate, ethoxylated bisphenol-A diacrylate, trimethylolpropane triacrylate, di-imethylolpropane tetraacrylate, triacrylate of tris(hydroxyethyl)isocyanurate, dipentaerythritol hydroxypentaacrylate, pentaerythritol triacrylate, ethoxylated trimethylolpropane triacrylate, triethylene glycol dimethacrylate, ethylene glycol dimethacrylate, tetraethylene glycol dimethacrylate, polyethylene glycol-200 dimethacrylate, 1,6-hexanediol dimethacrylate, neopentyl glycol dimethacrylate, polyethylene glycol-600 dimethacrylate, 1,3-butylene glycol dimethacrylate, ethoxylated bisphenol-A dimethacrylate, trimethylolpropane trimethacrylate, diethylene glycol dimethacrylate. 1,4-butanediol diacrylate, diethylene glycol dimethacrylate, pentaerythritol tetramethacrylate, glycerin dimethacrylate, trimethylolpropane dimethacrylate, pentaerythritol trimethacrylate, pentaerythritol dimethacrylate, pentaerythritol diacrylate, urethanemethacrylate or acrylate oligomers and the like which can be added to the photopolymerizable composition to modify the cured product. Monoacrylates including, for example, cyclohexyl acrylate, isobornyl acrylate, lauryl acrylate and tetrahydrofurfuryl acrylate and the corresponding methacrylates are also usable in the practice of the invention. Especially preferred acrylate monomers include hexanediol diacrylate (HDDA) and trimethylolpropane triacrylate (TMPTA). Especially preferred methacrylate monomers include hexanediol dimethacrylate (HDDMA) and triemethylolpropane trimethacrylate (TMPTA). It is generally preferred that the one or more monomers be present in at least an amount of 5% by weight of the photosensitive layer.

The photocurable layer also preferably contains a compatible plasticizer, which serves to lower the glass transition temperature of the binder and facilitate selective development. Suitable plasticizers include, but are not limited to, dialkyl phthalates, alkyl phosphates, polyethylene glycol, polyethylene glycol esters, polyethylene glycol ethers, polybutadiene, polybutadiene styrene copolymers, hydrogenated, heavy naphthenic oils, hydrogenated, heavy paraffinic oils, and polyisoprenes. Other useful plasticizers include oleic acid, lauric acid, etc. The plasticizer is generally present in an amount of at least 10% by weight, based on weight of total solids of the photopolymer composition. Commercially available plasticizers for use in compositions of the invention include 1,2-polybutadiene, available from Nippon Soda Co. under the tradename Nisso PB B-1000; Ricon 183, which is a polybutadiene styrene copolymer, available from Cray Valley; Nyflex 222B, which is a hydrogenated heavy naphthenic oil, available from Nynas AB; ParaLux 2401, which is a hydrogenated heavy paraffinic oil, available from Chevron U.S.A., Inc.; and Isolene 40-S, which is a polyisoprene available from Royal Elastomers.

Various dyes and/or colorants may also optionally be used in the practice of the invention although the inclusion of a dye and/or colorant is not necessary to attain the benefits of the present invention. Suitable colorants are designated "window dyes" which do not absorb actinic radiation in the region of the spectrum that the initiator present in the composition is activatable. The colorants include, for example, CI 109 Red dye, Methylene Violet (CI Basic Violet 5), "Luxol." Fast Blue MBSN (CI Solvent Blue 38), "Pontacyl" Wool Blue BL (CI Acid Blue 59 or CI 50315), "Pontacyl" Wool Blue GL (CI Acid Blue 102 or CI 50320), Victoria Pure Blue BO (CI Basic Blue 7 or CI 42595), Rhodamine 3 GO (CI Basic Red 4), Rhodamine 6 GDN (CI Basic Red I or CI 45160), 1,1'-diethyl-2,2'-cyanine iodide, Fuchsine dye (CI 42510), Calcocid Green S (CI 44090) and Anthraquinone Blue 2 GA (CI Acid Blue 58), etc. The dyes and/or colorants must not interfere with the imagewise exposure.

Other additives including antiozonants, fillers or reinforcing agents, thermal polymerization inhibitors, UV absorbers, etc. may also be included in the photopolymerizable composition, depending on the final properties desired. Such additives are generally well known in the art.

Suitable fillers and/or reinforcing agents include immiscible, polymeric or nonpolymeric organic or inorganic fillers or reinforcing agents which are essentially transparent at the wavelengths used for exposure of the photopolymer material and which do not scatter actinic radiation, e.g., polystyrene, the organophilic silicas, bentonites, silica, powdered glass, colloidal carbon, as well as various types of dyes and pigments. Such materials are used in amounts varying with the desired properties of the elastomeric compositions. The fillers are useful in improving the strength of the elastomeric layer, reducing tack and, in addition, as coloring agents.

Thermal polymerization inhibitors include, for example, p-methoxyphenol, hydroquinone, and alkyl and aryl-substituted hydroquinones and quinones, tert-butyl catechol, pyrogallol, copper resinate, naphthalamines, beta-naphthol, cuprous chloride, 2,6-di-tert-butyl-p-cresol, butylated hydroxytoluene (BHT), oxalic acid, phenothiazine, pyridine, nitrobenzene and dinitrobenzene, p-toluquinone and chloranil. Other similar polymerization inhibitors would also be usable in the practice of the invention.

Using the photoinitiators described herein, it is possible to produce printing plates having printing dots that exhibit desired geometric characteristics for printing, including planarity of a top surface of the dots and edge sharpness of the dots. Furthermore, these desired characteristics can be achieved without using an oxygen barrier layer in the process and without altering the type, power or incident angle of radiation during the exposure step. Finally, the method described herein may also be conducted in the presence of atmospheric oxygen.

What is claimed is:

1. A method of making a relief image printing element comprising a plurality of relief printing dots, the method comprising the steps of:
    a) providing at least one photocurable layer disposed on a backing layer, the at least one photocurable layer being capable of being selectively crosslinked and cured upon exposure to actinic radiation, the at least one photocurable layer comprising:
        i) an ethylenically unsaturated monomer;
        ii) a binder; and
        iii) a photoinitiator, the photoinitiator exhibiting a quantum yield of initiation (Qi) of more than 0.05 at a 365 nm wavelength;
    b) imagewise exposing the at least one photocurable layer to actinic radiation to selectively crosslink and cure portions of the at least one photocurable layer; and
    c) developing the relief image printing element, to separate and remove uncrosslinked and uncured portions of the at least one photocurable layer to reveal a relief image therein, wherein the relief image comprises the plurality of relief printing dots, and
    wherein the plurality of relief printing dots exhibit an edge sharpness of the dots such that the ratio of the radius of curvature at the intersection of the shoulder and the top surface of the dot, $r_e$, to the width of the top of the dot, p, is less than 5%; and
    wherein the step of imagewise exposing the at least one photocurable layer to actinic radiation is conducted in the presence of atmospheric oxygen.

2. The method according to claim 1, wherein the photoinitiator exhibits a quantum yield of initiation (Qi) greater than 0.075 at the 365 nm wavelength.

3. The method according to claim 2, wherein the photoinitiator exhibits a quantum yield of initiation (Qi) greater than 0.08 at the 365 nm wavelength.

4. The method according to claim 1, wherein an extinction coefficient of the photoinitiator is greater than 300 $1 \cdot cm^{-1} \cdot mol^{-1}$ at a 365 nm wavelength.

5. The method according to claim 4, wherein the extinction coefficient of the photoinitiator is greater than 400 $1 \cdot cm^{-1} \cdot mol^{-1}$ at the 365 nm wavelength.

6. The method according to claim 5, wherein the extinction coefficient of the photoinitiator is greater than 500 $1 \cdot cm^{-1} \cdot mol^{-1}$ at the 365 nm wavelength.

7. The method according to claim 1, wherein the photoinitiator is selected from the group consisting of 1-butanone-2-(dimethylamino)-2-[(4-methylphenyl)methyl]-1-[4-(4-morpholinyl)phenyl], 2-benzyl-2-dimethylamino-1-(4-morpholinophenyl)-butanone-1, Diphenyl(2,4,6-trimethylbenzoyl)phosphine oxide, and combinations of one or more of the foregoing.

8. The method according to claim 1, wherein the photoinitiator is present in the at least one photocurable layer at a concentration of between 1.5 and 5.0 percent by weight.

9. The method according to claim 8, wherein the photoinitiator is present in the at least one photocurable layer at a concentration of between 2.0 and 3.5 percent by weight.

10. The method according to claim 1, wherein the step of imagewise exposing the at least one photo curable layer to actinic radiation is conducted without altering of a type, power or incident angle of radiation during the exposure step.

* * * * *